(12) United States Patent
Durlam et al.

(10) Patent No.: US 6,365,419 B1
(45) Date of Patent: Apr. 2, 2002

(54) HIGH DENSITY MRAM CELL ARRAY

(75) Inventors: Mark Durlam, Chandler; Mark DeHerrera, Tempe; Eugene Chen, Gilbert; Saied Tehrani, Tempe; Gloria Kerszykowski, Fountain Hills; Peter K. Naji, Phoenix; Jon Slaughter, Tempe; Kelly W. Kyler, Mesa, all of AZ (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/649,114

(22) Filed: Aug. 28, 2000

(51) Int. Cl.[7] ............................................... H01L 21/00
(52) U.S. Cl. ............................ 438/3; 438/57; 257/421
(58) Field of Search ................................. 438/3, 57, 74, 438/421; 257/422

(56) References Cited

U.S. PATENT DOCUMENTS 5,650,958 A  *  7/1997  Gallagher et al. ........... 365/173
5,804,458 A  *  9/1998  Tehrani et al. ................ 438/3

* cited by examiner

Primary Examiner—Charles Bowers
Assistant Examiner—William M. Brewster
(74) Attorney, Agent, or Firm—William E. Koch (57) ABSTRACT

A method of fabricating an MRAM cell includes providing an isolation transistor on a semiconductor substrate and forming an interconnect stack on the substrate in communication with one terminal of the transistor. A via is formed on the upper end of the stack so as to extend from a position below the digit line to a position above the digit line. The via also extends above the upper surface of a dielectric layer to provide an alignment key. A MTJ memory cell is positioned on the upper surface in contact with the via, and the ends of a free layer of magnetic material are spaced from the ends of a pinned edge of magnetic material by using sidewall spacers and selective etching.

27 Claims, 5 Drawing Sheets

HIGH DENSITY MRAM CELL ARRAY

FIELD OF THE INVENTION

This invention relates to apparatus and method for increasing the density of MRAM cells in a memory array.

BACKGROUND OF THE INVENTION

The architecture for Magnetoresistive Random Access Memory (MRAM) is composed of a plurality or array of memory cells and a plurality of digit and bit line intersections. The magnetoresistive memory cell generally used is composed of a magnetic tunnel junction (MTJ), an isolation transistor, and the intersection of digit and bit lines. The isolation transistor is generally a N-channel field effect transistor (FET). An interconnect stack connects the isolation transistor to the MTJ device, to the bit line, and to the digit line used to create part of the magnetic field for programming the MRAM cell. A standard CMOS process that utilizes a planar interconnect backend is generally used for the integration of the MRAM cells. Planar backend interconnect schemes are found in architectures using tungsten stud or damascene copper interconnects. The interconnect stack of the CMOS process can be either Al—Cu or copper based interconnect materials. The number of interconnect layers in the CMOS process may vary, depending upon the specific memory and devices associated with the memory which are fabricated on the same chip. Because the memory includes hundreds of thousands of cells, even small area savings in each cell can result in major advantages in density of the memory.

Accordingly it is highly desirable to provide apparatus and a method of improving the density of MRAM cells in a memory array by reducing the area of individual MRAM cells.

BRIEF DESCRIPTION OF THE DRAWINGS

Referring to the drawings.

DESCRIPTION OF THE PREFERRED EMBODIMENTS

Figures 1, 2, 3:
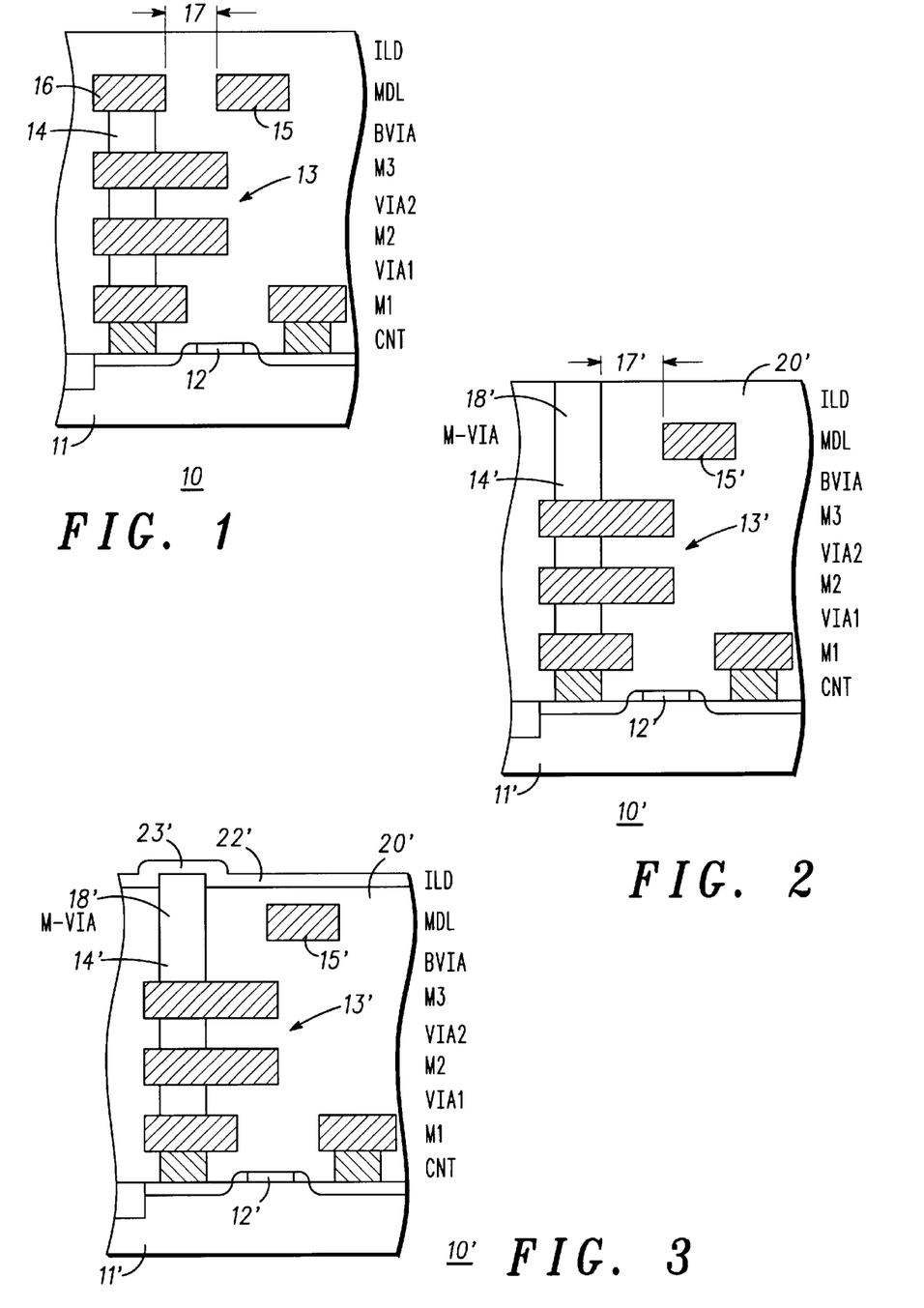
FIG. 1 is a sectional view of an interconnect for an MRAM cell illustrating the use of a standard CMOS process in the line and stack formation.
FIG. 2 is a sectional view, similar to FIG. 1, of an interconnect for an MRAM cell illustrating the use of novel steps in accordance with the present invention in the line and stack formation.
FIG. 3 is a sectional view, similar to FIG. 2, illustrating further steps in the stack formation in a novel process in accordance with the present invention.

Referring specifically to FIG. 1, a sectional view of an interconnect for a MRAM cell 10 is illustrated using a standard CMOS process in the line and stack formation. Cell 10 includes a semiconductor substrate 11 having an isolation transistor 12 formed thereon. In accordance with the standard and well known CMOS process, an interconnect stack 13 of vias and metallization layers are formed to provide the interconnections for the integrated circuit and the memory cell array in which cell 10 is included. Interconnect stack 13 is formed by providing dielectric layers, masking and etching, and metal deposition all in a well known manner. Also in accordance with the standard and well known process, the metal including the first vias on the source and drain terminals of isolation transistor 12 is referred to as the contact layer (CNT). The metalization layer forming the first layer of interconnects is referred to as the first metalization layer (M1). Vias formed on layer M1 are referred to as the first via layer (Via1), the next metallization layer is the second metalization layer (M2), followed sequentially by a via layer Via2, a third metalization layer M3, and as many, more or less, additional via layers and metalization layers as are needed to provide the desired interconnect for the specific apparatus and application.

A final via 14, in a layer designated BVia, is provided for connecting isolation transistor 12 to a magnetic tunnel junction (MTJ) bit cell, to be explained presently. Another metalization layer, designated MDL, includes a digit line 15 associated with the MTJ bit cell (not shown). At this point it is standard practice to provide a metalization connection 16 to via 14 and digit line 15 in metalization layer MDL using the same lithography step. The major problem with this procedure is that the size or area of connection 16 has a lower limit or minimum area value within the lithography process, since it is printed with digit line 15. In general, the minimum length is 2 times the minimum width when lines and connections are included in the same lithography step. Also, connection 16 must be spaced a minimum distance, designated 17, from digit line 15. The minimum area value of connection 16 severely restricts or limits the size to which MRAM cell 10 can be reduced. The minimum distance spacing of features printed on the same layer is better than the spacing between features on different lithography layers. The fundamental reason is that there is no overlay error between features printed on the same layer.

Turning now to FIG. 2, a sectional view, similar to FIG. 1, of an interconnect for an MRAM cell 10' is illustrated in accordance with the present invention. In FIG. 2, components similar to components in FIG. 1 are designated with similar numbers and a prime is added to all numbers to indicate the different embodiment. In this embodiment, a via 14' at the upper end of interconnect stack 13' is included in connection with metalization layer M3, but metalization connection 16 (FIG. 1) is not included in the process. A memory via 18', also designated M-Via, is formed through all of the intervening layers to connect with via 14'. Digit line 15' is formed independent of interconnect stack 13'. Since the minimum area value of via 18' is not included with the digit line 15' lithography step both digit line 15' and via 18' can be made to be minimum lithography. Therefore, the only limit is on the distance 17' from interconnect stack 13'. When via 18' is printed independent of line 15' the length to width ratio can be one, thus minimizing the area requirement of the feature.

With digit line 15' completed, a final dielectric layer 20' is deposited and the upper surface is smoothed by some convenient method, such as mechanical polishing or the like. Dielectric layer 20' is made much thinner than standard interlayer dielectric in order to increase magnetic coupling between digit line 15' to the magnetic element deposited on the top surface of dielectric 20'. Since dielectric layer 20' is thin, the aspect ratio of the via 18' is substantially maintained at the standard minimum aspect ratio, therefore making it possible to print and fill minimum geometry via 18'. Digit line 15' still requires a connection to via 14' in other parts of the circuit, outside the memory core (not shown). Via 18' (MVia) cannot connect to M3 because it would disconnect MDL from the other parts of the circuit. Because via 18' (MVia) is restricted in its use and feature size (feature size is held constant), the lithography process can be optimized to print this small feature, similar to a via. The lithography process cannot be optimized to print minimum features and large features concurrently.

Continuing in the process of fabricating MRAM cell 10', a blanket layer of material is deposited over the smoothed upper surface of dielectric layer 20', in a first step of the fabrication process of the MTJ bit cell (not shown). Generally the blanket layer will be a metallization to connect interconnect via 18; of stack 13' to the MTJ bit cell. If the blanket layer is deposited and smoothed to allow deposition of the MTJ bit cell components, some alignment key or feature must be placed on the layer to allow proper alignment for subsequent masking and etching steps. The provision of the alignment keys in this fashion requires additional steps and introduces additional alignment tolerances which can increase misalignment in subsequent steps. To overcome this problem, a novel process to expose alignment keys is provided in the present invention as illustrated in FIG. 3.

Referring specifically to FIG. 3, a thin layer of upper dielectric layer 20' is removed so that alignment keys printed and processed in the same metallization layer as via 18' protrude slightly above the upper surface. While the amount that via 18' protrudes above the surface of dielectric layer 20' is mostly dependent upon the processes used in removal and subsequent alignment, it has been found that approximately 300Å is an adequate amount to get a clear alignment signal for this purpose. The small amount of dielectric layer 20' can be removed by any convenient method including selective etching, mechanical polishing, etc. With a portion of dielectric layer 20' removed so that via 18' protrudes slightly, a blanket connecting metalization layer 22' is deposited. Via 18' produces a bump 23' in layer 22' which is used as an alignment key in subsequent steps. By keying or aligning subsequent steps to via 18', the alignment is more accurate than it would be by forming an additional alignment key in layer 23'. Also, the addition of the step to remove a portion of layer 20' does not add substantially to the complexity of the fabrication process, since a polishing or smoothing step is already included for layer 20' and this step is simply performed for an additional short period of time.

Figure 4:
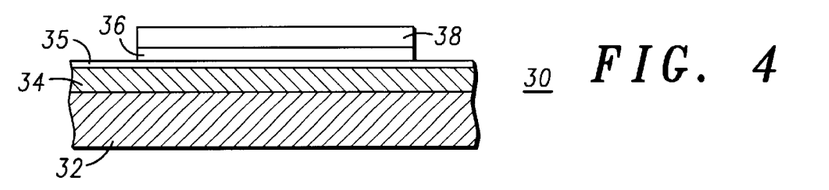
FIGS. 4, 5, and 6 are a series of sectional views of an MTJ memory cell illustrating the importance of uniform spacing of the ends of the magnetic layers.
Figure 5:
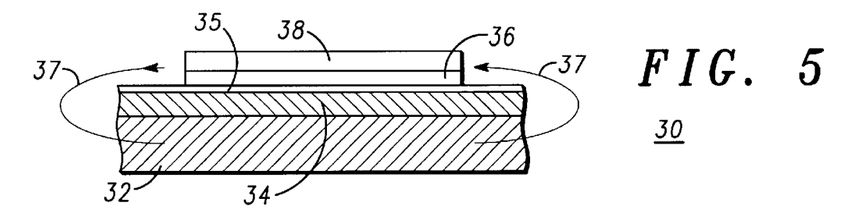
Figure 6:
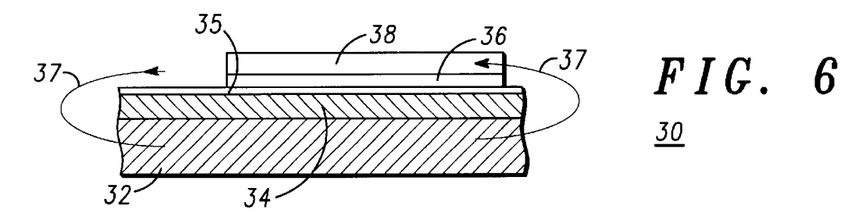

Turning now to FIGS. 4, 5, and 6, a series of sectional views of an MTJ memory cell 30 are illustrated to explain the importance of uniform spacing of the ends of the magnetic layers. As illustrated specifically in FIG. 4, MTJ memory cell 30 includes a non-magnetic conductor 32 forming a lower electrical contact for MTJ memory cell 30. Note that, in the above description, layer 23' of FIG. 3 is generally the same as conductor 32 in FIG. 4. MTJ memory cell 30 further includes a pinned magnetic layer 34, a tunnel barrier layer 35 positioned on layer 34, a free magnetic layer 36, positioned on layer 35, and a top metal layer 38 positioned on free magnetic layer 36. Additional information as to the fabrication and operation of MTJ memory cells can be found in U.S. Pat. No. 5,702,831, entitled "Multi-Layer Magnetic Tunneling Junction Memory Cells", issued Mar. 31, 1998, and incorporated herein by reference.

It should be noted that the pattern transfer of free magnetic layer 36 and pinned magnetic layer 34 is important to the parameters of MTJ memory cell 30. That is, when the ends of free magnetic layer 36 are positioned substantially equal distances from the ends of pinned magnetic layer 34, as illustrated in FIG. 5, the magnetic flux lines (illustrated by arrows 37 in FIG. 5) are equal, indicating a balanced coupling between free magnetic layer 36 and pinned magnetic layer 34. When the distances between the ends are unequal, as illustrated in FIG. 6, due to overlay or misregistration during the fabrication process, an unbalanced magnetic coupling results. The effect of the unbalanced magnetic coupling is a shift in the hysteresis loop for the MTJ memory cell which, as will be understood by those skilled in the art, produces a difference in the reading and writing levels for the cell.

Figure 7:
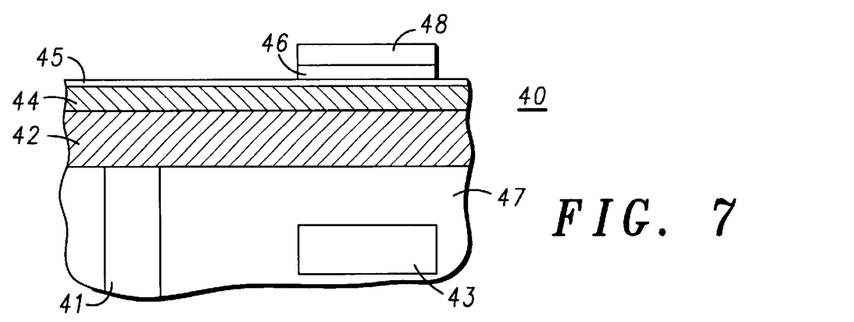
FIGS. 7 through 13 are sectional and top plan views illustrating sequential steps in a process of fabricating an MTJ memory cell in accordance with the present invention.
Figure 8:
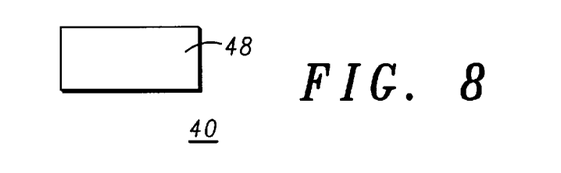
Figure 12:
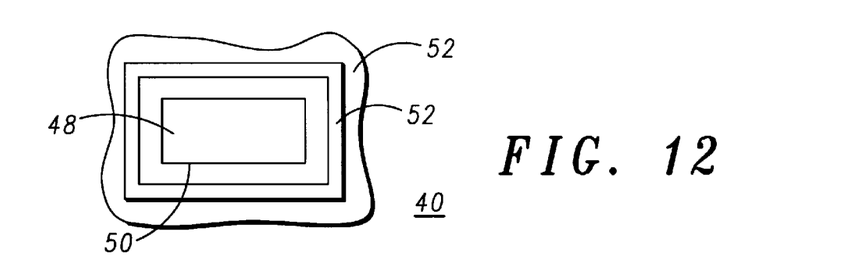
Figure 13:
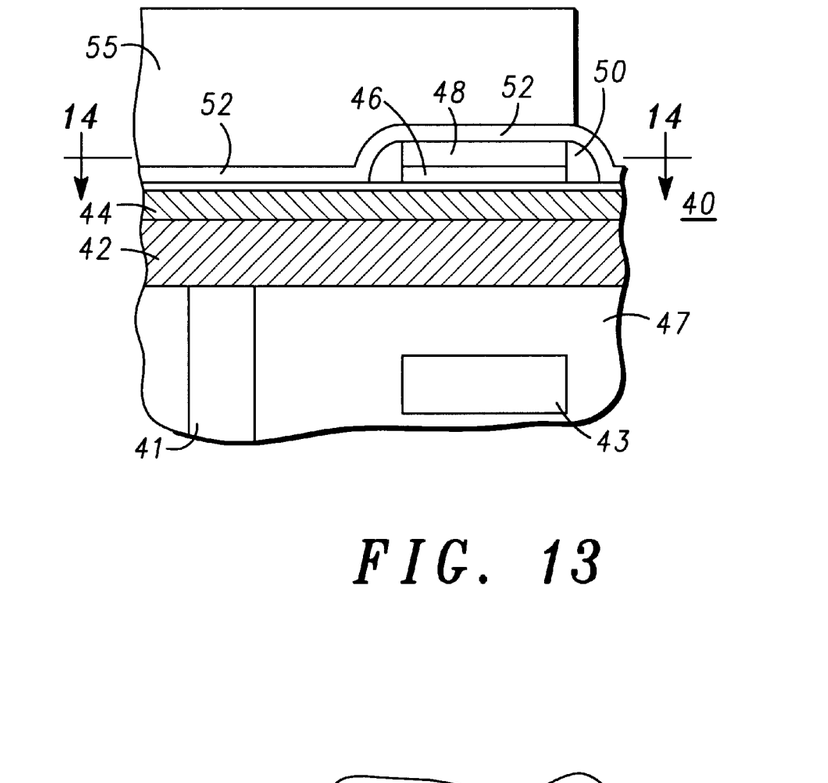
Figure 14:
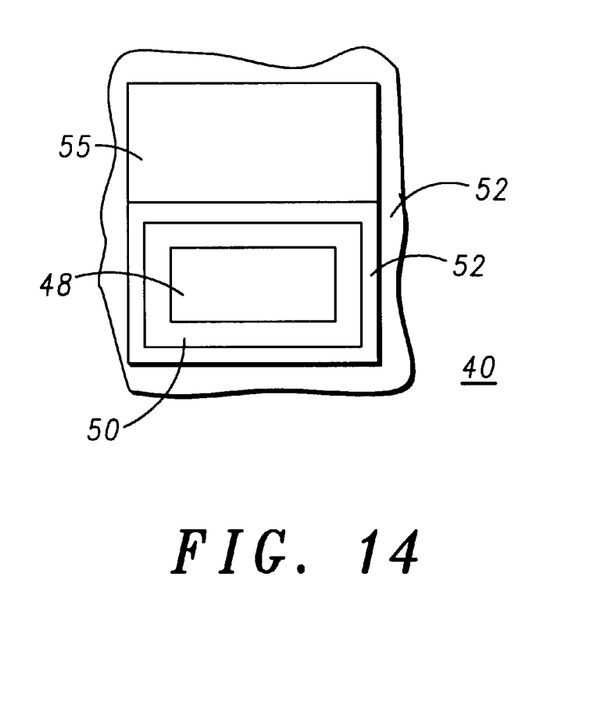
FIG. 14 is a sectional view as seen from the line 14—14 in FIG. 13.

Turning now to FIG. 7 though FIG. 14, a series of sectional and top views are shown illustrating sequential steps in a fabrication process for an MTJ memory cell in accordance with the present invention. Here it should be understood that only a single memory cell is illustrated for convenience but generally a complete array of cells (or arrays of cells) will be formed simultaneously. Referring specifically to FIGS. 7 and 8, MTJ memory cell 40 includes a non-magnetic conductor 42 forming a lower electrical contact for MTJ memory cell 40 to a via 41. A digit line 43 extends perpendicular to FIG. 7, into and out of the paper with via 41 and digit line 43 formed in a dielectric layer 47 generally as described above. MTJ memory cell 40 further includes a pinned magnetic layer 44, a tunnel barrier layer 45 positioned on layer 44, a free magnetic layer 46 positioned on layer 45, and a top metal layer 48 positioned on free magnetic layer 46. Layers 42, 44, 45, 46 and 48 are each deposited as blanket layers and free magnetic layer 46 and top metal layer 48 are patterned in a well known manner. Top metal layer 48 is illustrated in top plan view in FIG. 8.

Figure 9:
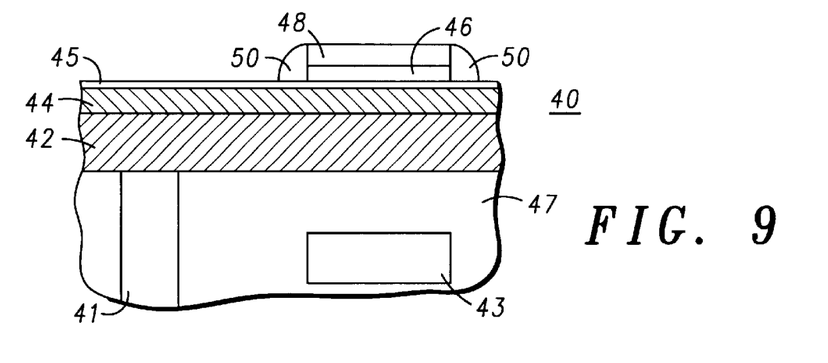
Figure 10:
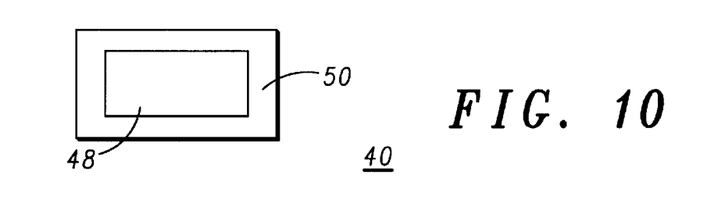
Figure 11:
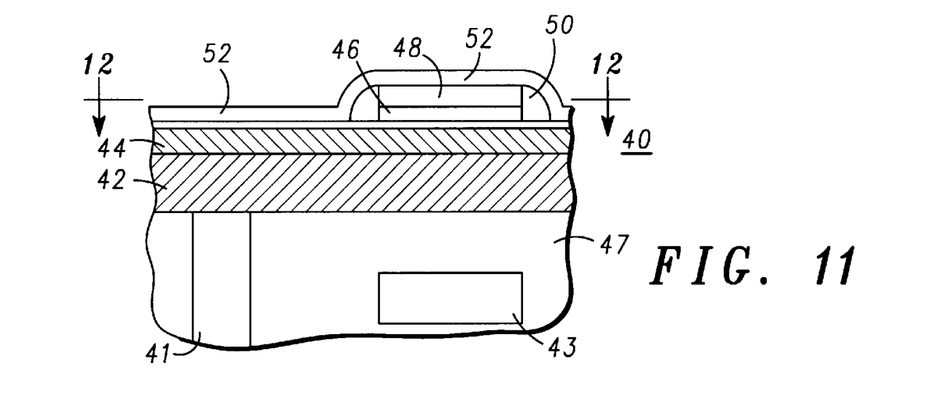

With free magnetic layer 46 deposited and patterned in a desired position relative to via 41 and digit line 43, sidewall spacer 50 is formed on all four sides of free magnetic layer 46 and top metal layer 48, as illustrated in the sectional view of FIG. 9 and the top plan view of FIG. 10. Sidewall spacer 50 may be formed using any of the well known processes for the formation of sidewalls and, as is known in the art, the thickness or spacing provided by sidewall 50 can be adjusted in a variety of ways during the process. A thick etch stop layer 52 is deposited as a blanket layer over the entire area of MTJ memory cell 40, as illustrated in FIG. 11. A sectional view, as seen from a line 12—12 in FIG. 11 is illustrated in FIG. 12.

Referring specifically to FIGS. 13 and 14, a blanket hardmask layer 55 is deposited over the entire area of MTJ memory cell 40 on etch stop layer 52. Using standard mask and etch techniques, hardmask layer 55 is formed to overlie or define only a desired portion of MTJ memory cell 40. Here it will be understood that hardmask layer 55 can include any material which is capable of being selectively etched relative to etch stop layer 52. For example, hardmask layer 55 can include aluminum nitride (AlN) or the like which can be conveniently etched with a wet etch or a chlorine chemistry etch that will have little or no effect on etch stop layer 52. Etch stop layer 52 can include a silicon oxide or the like which can be conveniently etched, along with blanket layers 45, 44, and 42 by an etch that will have little or no effect on hardmask layer 55. Thus, hardmask layer 55 is deposited and etched to define the limits of MTJ memory cell 40 and is then used as a hardmask to etch layers 52, 45, 44 and 42 to actually form MTJ memory cell 450. In this process sidewall spacer 50 is used to specifically position the ends of free magnetic layer 46 and top metal layer 48 substantially equal distances from the ends of pinned magnetic layer 44.

Figure 15:
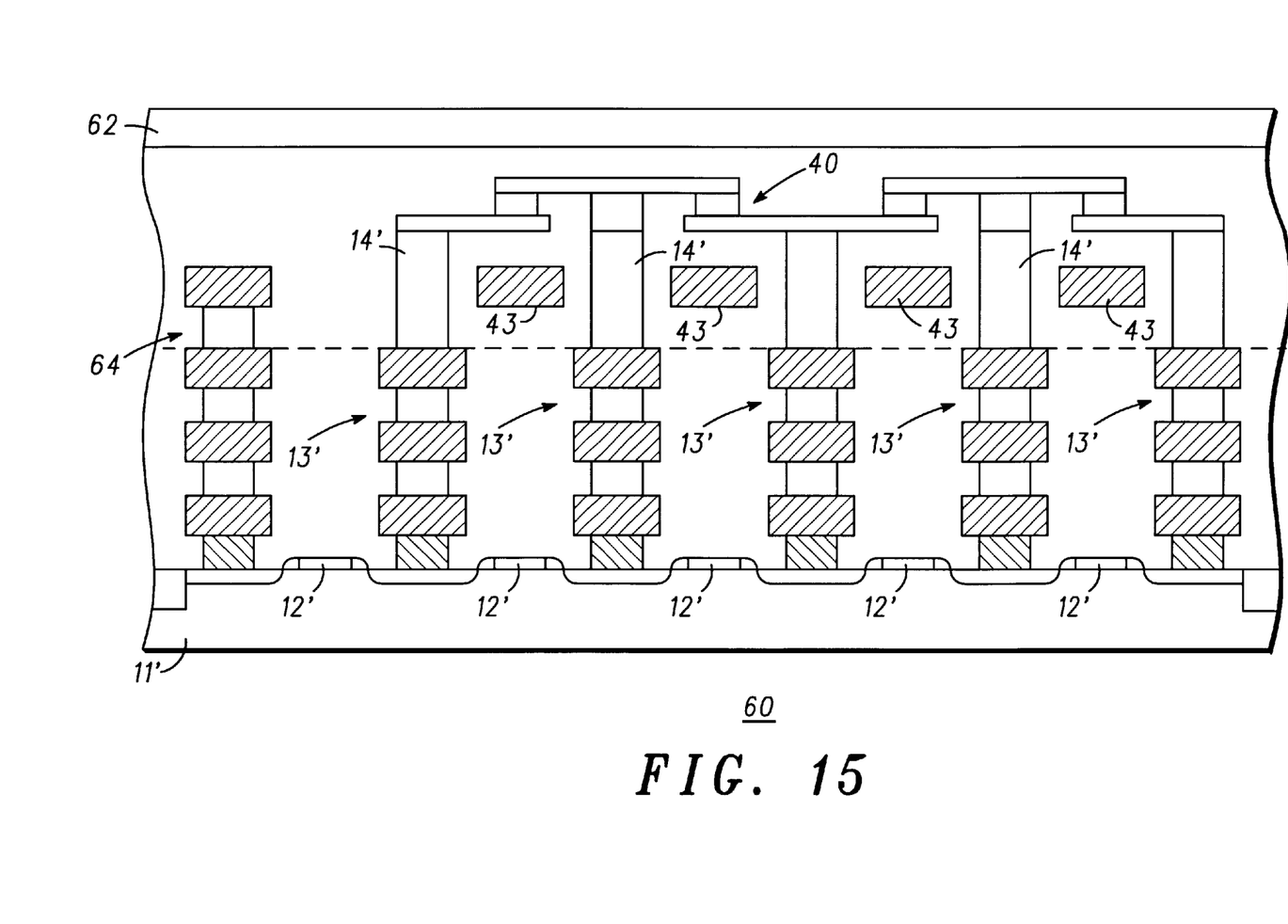
FIG. 15 is a simplified sectional view of a complete compact magnetoresistive random access memory cell in accordance with the present invention.

Referring specifically to FIG. 15, a simplified sectional view of a complete array 60 of compact MRAM cells 40 (each cell being similar to cell 40 of FIGS. 13 and 14) in accordance with the present invention. Each MRAM cell 40 has associated therewith an interconnect stack 13' and an isolation transistor 12', all formed on and supported by a substrate 11', as explained above. Each interconnect stack 13' is terminated in an extended via 14' (generally as described above) that extends through at least two layers of material and eliminates the metalization connection or line termination normally used. A bit line 62, associated with each row (or column) of array 60 is connected through an extended via and interconnect stack 64 to one of the isolation transistors 12'. Here it should be understood that one digit line 43 is associated with each column (or row) of array 60. While lines 43 are referred to herein as "digit lines" and lines 62 are referred to as "bit lines" for convenience in this explanation, it will be understood that these titles could be reversed or changed in specific applications (e.g., program lines) and are not intended to in any way limit the invention.

Thus, a method of fabricating a compact magnetoresistive random access memory cell and/or an array of cells is disclosed. The method includes terminating interconnect stacks with a via, which extends through several layers, to eliminate the need for a line termination or metalization connection. Since the metalization connection or line termination requires a lower limit or minimum area value within the lithography process, the novel use of the extended via reduces the area of each memory cell and, therefore, substantially reduces the overall area of an array of memory cells. Also, the upper end of the via is exposed and used to form an alignment key, which eliminates a number of steps normally required for the formation of alignment keys and reduces alignment tolerances for better alignment of components within each memory cell. Further, the ends of the free magnetic layer in each MTJ memory cell are positioned substantially equal distances from the ends of the pinned magnetic layer so that a balanced coupling between the free magnetic layer and the pinned magnetic layer is consistently achieved. The equal distances of the ends are accomplished through the use of sidewall spacers and selective etching.

While we have shown and described specific embodiments of the present invention, further modifications and improvements will occur to those skilled in the art. We desire it to be understood, therefore, that this invention is not limited to the particular forms shown and we intend in the appended claims to cover all modifications that do not depart from the spirit and scope of this invention.

What is claimed is:

1. A method of fabricating a compact magnetoresistive random access memory cell comprising the steps of:
   providing a semiconductor substrate having an isolation transistor thereon;
   forming an interconnect stack on the substrate in communication with one terminal of the transistor;
   positioning a bit line adjacent an upper end of the interconnect stack; and
   forming a via on the upper end of the interconnect stack so as to extend from a position below the bit line to a position above the bit line.

2. A method of fabricating a compact magnetoresistive random access memory cell as claimed in claim 1 wherein the step of forming the via includes extending the via through at least two layers of material.

3. A method of fabricating a compact magnetoresistive random access memory cell as claimed in claim 1 wherein the step of forming the via includes providing a layer of dielectric material covering the bit line and surrounding an upper end of the via, the layer of dielectric material having an upper surface.

4. A method of fabricating a compact magnetoresistive random access memory cell as claimed in claim 3 wherein the step of providing the layer of dielectric material includes forming the layer of dielectric material so that the upper end of the via extends above the upper surface of the layer of dielectric material to provide an alignment key.

5. A method of fabricating a compact magnetoresistive random access memory cell as claimed in claim 4 including in addition a step of positioning a magnetic tunnel junction memory cell on the upper surface of the layer of dielectric material.

6. A method of fabricating a compact magnetoresistive random access memory cell as claimed in claim 5 wherein the magnetic tunnel junction memory cell is formed in a stack of layers and a programming line is formed in a layer below the magnetic tunnel junction.

7. A method of fabricating a compact magnetoresistive random access memory cell as claimed in claim 6 wherein the step of positioning the magnetic tunnel junction memory cell on the upper surface of the layer of dielectric material includes positioning a non-magnetic conductor on the upper surface of the layer of dielectric material and in contact with the via.

8. A method of fabricating a compact magnetoresistive random access memory cell as claimed in claim 7 wherein the step of positioning the magnetic tunnel junction memory cell on the upper surface of the layer of dielectric material further includes the steps of positioning a pinned layer of magnetic material on the non-magnetic conductor, positioning a tunnel barrier on the pinned layer of magnetic material, and positioning a free layer of magnetic material on the tunnel barrier.

9. A method of fabricating a compact magnetoresistive random access memory cell as claimed in claim 5 wherein the step of positioning the magnetic tunnel junction memory cell on the upper surface of the layer of dielectric material includes the steps of:
   depositing a blanket layer of conductive non-magnetic material on the upper surface of the layer of dielectric material and in contact with the via;
   depositing a blanket layer of magnetic material on the blanket layer of conductive non-magnetic material;
   depositing a blanket layer of tunnel barrier material on the blanket layer of magnetic material;
   forming a layer of free magnetic material on the blanket layer of tunnel barrier material and a top metal layer of top of the free magnetic layer, the layer of free magnetic material being positioned in overlying relationship to the bit line, the top metal layer having first and second ends and edges defining an extent for an area of the magnetic tunnel junction memory cell;
   forming sidewall spacers on the edges of the top metal layer;
   forming a hard mask overlying the top metal layer and at least portions of the sidewall spacers, the hard mask extending beyond the edges of the layer of free magnetic material; and
   using the hard mask, etching the blanket layer of tunnel barrier material, the blanket layer of magnetic material, and the blanket layer of conductive non-magnetic material to provide the blanket layer of magnetic material with edges which extend beyond the first and second ends of the layer of free magnetic material substantially equal distances.

10. A method of fabricating a compact magnetoresistive random access memory cell as claimed in claim 9 wherein the step of forming the hard mask includes the steps of depositing a blanket layer of etch stop material in overlying relationship to the layer of free magnetic material and the sidewall spacers, depositing a blanket layer of hard mask material, and masking and etching the layer of hard mask material using the etch stop layer to protect the sidewall spacers.

11. A method of fabricating a compact magnetoresistive random access memory cell as claimed in claim 10 wherein the step of etching the blanket layer of tunnel barrier material includes using the hard mask to etch the etch stop layer.

12. A method of fabricating a compact magnetoresistive random access memory cell as claimed in claim 10 wherein the step of forming the layer of free magnetic material includes depositing a contact layer of non-magnetic conductive material on an upper surface of the layer of free magnetic material.

13. A method of fabricating a compact magnetoresistive random access memory cell as claimed in claim 12 including in addition the steps of forming a via through the hard mask and forming another of a bit line and a digit line in overlying relationship to the hard mask and in contact with the contact layer of non-magnetic conductive material through the via.

14. A method of fabricating a compact magnetic tunnel junction memory cell comprising the steps of:
providing a blanket layer of magnetic material;
depositing a blanket layer of tunnel barrier material on the blanket layer of magnetic material;
forming a layer of free magnetic material on the blanket layer of tunnel barrier material, the layer of free magnetic material having first and second ends and edges defining an extent for an area of the magnetic tunnel junction memory cell;
forming a top metal layer with edges on the free magnetic layer;
forming sidewall spacers on the edges of the top metal layer;
forming a hard mask overlying the free magnetic layer and at least portions of the sidewall spacers, the hard mask extending beyond the edges of the top metal layer; and
using the hard mask, etching the blanket layer of tunnel barrier material and the blanket layer of magnetic material to provide the blanket layer of magnetic material with edges which extend beyond the first and second ends of the layer of free magnetic material substantially equal distances.

15. A method of fabricating a compact magnetic tunnel junction memory cell as claimed in claim 14 including in addition the step of providing a blanket layer of conductive non-magnetic material and the step of providing the blanket layer of magnetic material includes depositing the blanket layer of magnetic material on the blanket layer of conductive non-magnetic material, and the step of etching includes etching the blanket layer of conductive non-magnetic material.

16. A method of fabricating a compact magnetoresistive random access memory cell comprising the steps of:
providing a semiconductor substrate having an isolation transistor thereon;
forming an interconnect stack on the substrate in communication with one terminal of the transistor, the interconnect stack being formed at least partially in dielectric material;
positioning a bit line adjacent an upper end of the interconnect stack in the dielectric material;
depositing a blanket layer of conductive non-magnetic material on an upper surface of the layer of dielectric material in communication with the interconnect stack;
depositing a blanket layer of magnetic material on the blanket layer of conductive non-magnetic material;
depositing a blanket layer of tunnel barrier material on the blanket layer of magnetic material;
forming a layer of free magnetic material on the blanket layer of tunnel barrier material and a top metal layer on the free magnetic layer, the layer of free magnetic material being positioned in overlying relationship to the bit line, the top metal layer having first and second ends and edges defining an extent for an area of the magnetic tunnel junction memory cell;
forming sidewall spacers on the edges of the top metal layer;
forming a hard mask overlying the free magnetic layer and at least portions of the sidewall spacers, the hard mask extending beyond the edges of the layer of free magnetic material; and
using the hard mask, etching the blanket layer of tunnel barrier material, the blanket layer of magnetic material, and the blanket layer of conductive non-magnetic material to provide the blanket layer of magnetic material with edges which extend beyond the first and second ends of the layer of free magnetic material substantially equal distances.

17. A method of fabricating a compact magnetoresistive random access memory cell as claimed in claim 16 including in addition the step of forming a via on the upper end of the interconnect stack and in contact with the blanket layer of conductive non-magnetic material so as to extend from a position below the bit line to a position above the bit line.

18. A method of fabricating a compact magnetoresistive random access memory cell as claimed in claim 17 wherein the step of forming the via includes forming the via through the dielectric material so that the dielectric material surrounds an upper end of the via, the layer of dielectric material having an upper surface.

19. A method of fabricating a compact magnetoresistive random access memory cell as claimed in claim 18 wherein the step of forming the via includes forming the layer of dielectric material so that the upper end of the via extends above the upper surface of the layer of dielectric material to provide an alignment key.

20. A compact magnetoresistive random access memory cell comprising:
a semiconductor substrate having an isolation transistor therein;
an interconnect stack formed on the substrate and coupled to one terminal of the transistor;
a bit line positioned adjacent an upper end of the interconnect stack; and
a via formed on the upper end of the interconnect stack and extending from a position below the bit line to a position above the bit line.

21. A compact magnetoresistive random access memory cell as claimed in claim 20 wherein the via extends through at least two layers of material.

22. A compact magnetoresistive random access memory cell as claimed in claim 20 including in addition a layer of dielectric material covering the bit line and surrounding an upper end of the via, the layer of dielectric material having an upper surface.

23. A compact magnetoresistive random access memory cell as claimed in claim 22 wherein the upper end of the via extends above the upper surface of the layer of dielectric material to provide an alignment key.

24. A compact magnetoresistive random access memory cell as claimed in claim 23 including in addition a magnetic tunnel junction memory cell positioned on the upper surface of the layer of dielectric material.

25. A compact magnetoresistive random access memory cell as claimed in claim 24 including in addition a programming line positioned on a side of the magnetic tunnel junction memory cell opposite the bit line.

26. A compact magnetoresistive random access memory cell as claimed in claim 24 wherein the memory cell includes a non-magnetic conductor positioned on the upper surface of the layer of dielectric material and in contact with the via.

27. A compact magnetoresistive random access memory cell as claimed in claim 26 wherein the memory cell further includes a pinned layer of magnetic material positioned on the non-magnetic conductor, a tunnel barrier positioned on the pinned layer of magnetic material, and a free layer of magnetic material positioned on the tunnel barrier.

* * * * *

UNITED STATES PATENT AND TRADEMARK OFFICE
CERTIFICATE OF CORRECTION

PATENT NO. : 6,365,419 B1
DATED : April 2, 2002
INVENTOR(S) : Durlam et al.

It is certified that error appears in the above-identified patent and that said Letters Patent is hereby corrected as shown below:

<u>Column 1,</u>
Line 2, please add as a new first paragraph the following paragraph:
-- This invention was made with Government support under Agreement No. MDA972-96-3-0016 awarded by DARPA. The Government has certain rights in the invention. --

Signed and Sealed this

Seventh Day of October, 2003

JAMES E. ROGAN
*Director of the United States Patent and Trademark Office*